(12) United States Patent
Gavillet et al.

(10) Patent No.: US 9,362,201 B2
(45) Date of Patent: Jun. 7, 2016

(54) HEAT EXCHANGE STRUCTURE AND COOLING DEVICE COMPRISING SUCH A STRUCTURE

(75) Inventors: Jerome Gavillet, Saint Egreve (FR); Nadia Caney, Le Fontanil (FR); Stephane Colasson, Voreppe (FR); Philippe Marty, Saint Martin D'Uriage (FR); Hai Trieu Phan, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 1152 days.

(21) Appl. No.: 13/056,523

(22) PCT Filed: Jul. 30, 2009

(86) PCT No.: PCT/EP2009/059848
§ 371 (c)(1),
(2), (4) Date: Apr. 14, 2011

(87) PCT Pub. No.: WO2010/012798
PCT Pub. Date: Feb. 4, 2010

(65) Prior Publication Data
US 2011/0198059 A1 Aug. 18, 2011

(30) Foreign Application Priority Data
Aug. 1, 2008 (FR) ...................................... 08 55336

(51) Int. Cl.
*F28D 15/00* (2006.01)
*F28F 7/00* (2006.01)
(Continued)

(52) U.S. Cl.
CPC ............ *H01L 23/473* (2013.01); *F28D 15/046* (2013.01); *F28F 13/185* (2013.01);
(Continued)

(58) Field of Classification Search
CPC ... F28D 15/046; F28D 15/043; H01L 23/427; H01L 23/467
USPC .................... 165/10.26, 104.21, 80.3; 216/37
See application file for complete search history.

(56) References Cited

U.S. PATENT DOCUMENTS 3,301,314 A * 1/1967 Gaertner ................. A47J 36/02
159/1.1
5,453,641 A 9/1995 Mundinger et al.
(Continued)

FOREIGN PATENT DOCUMENTS

EP 1 662 852 A1 5/2006
JP 2004-28444 1/2004
(Continued)

OTHER PUBLICATIONS

International Search Report Issued Sep. 16, 2009 in PCT/EP09/059848.
(Continued)

*Primary Examiner* — Claire Rojohn, III
(74) *Attorney, Agent, or Firm* — Oblon, McClelland, Maier & Neustadt, L.L.P

(57) ABSTRACT

A heat exchange structure is provided, including a primary face provided with non-through holes formed in said face, the inner surface of the holes and the surface of said primary face outside the holes being covered with nanoparticles, the inside of the holes having a non-wettability property relative to a given liquid and the surface of the face between the holes having a wettability property relative to the liquid.

9 Claims, 7 Drawing Sheets

(51) Int. Cl.
*H01L 23/473* (2006.01)
*F28D 15/04* (2006.01)
*F28F 13/18* (2006.01)
*H01L 23/373* (2006.01)
*H01L 23/427* (2006.01)

(52) U.S. Cl.
CPC ............ *F28F13/187* (2013.01); *H01L 23/373* (2013.01); *H01L 23/3732* (2013.01); *H01L 23/427* (2013.01); *F28F 2245/02* (2013.01); *F28F 2245/04* (2013.01); *H01L 2924/0002* (2013.01)

(56) References Cited

U.S. PATENT DOCUMENTS

| | | | | |
|---|---|---|---|---|
| 8,673,781 | B2* | 3/2014 | Oishi | H01L 21/0475 216/37 |
| 8,721,901 | B2* | 5/2014 | Sinha | H01L 21/76814 216/18 |
| 2001/0041309 | A1* | 11/2001 | Kim | H01L 21/32139 430/313 |
| 2001/0054495 | A1* | 12/2001 | Yevin | F28D 15/02 165/104.26 |
| 2002/0036183 | A1* | 3/2002 | Shibata | G03F 7/40 216/44 |
| 2002/0117293 | A1* | 8/2002 | Campbell | 165/133 |
| 2002/0148594 | A1* | 10/2002 | Gebhart | 165/47 |
| 2003/0062334 | A1* | 4/2003 | Lee | B29C 43/003 216/37 |
| 2004/0238160 | A1 | 12/2004 | Luo | |
| 2006/0000796 | A1* | 1/2006 | Tan | H01L 21/31144 216/37 |
| 2006/0108097 | A1* | 5/2006 | Hodes et al. | 165/80.4 |
| 2006/0159916 | A1* | 7/2006 | Dubrow | B01J 20/3291 428/357 |
| 2007/0028588 | A1* | 2/2007 | Varanasi et al. | 60/39.5 |
| 2007/0158052 | A1 | 7/2007 | Lin | |
| 2007/0228002 | A1* | 10/2007 | Geng | H01L 21/0337 216/37 |
| 2007/0235847 | A1 | 10/2007 | Ramanathan et al. | |
| 2008/0061029 | A1* | 3/2008 | Lai | B81C 1/00626 216/37 |
| 2008/0105406 | A1* | 5/2008 | Chang et al. | 165/104.26 |
| 2008/0308526 | A1* | 12/2008 | Pandhumsoporn | H01L 21/31138 216/37 |
| 2009/0039055 | A1* | 2/2009 | Ting | B01J 23/745 216/37 |
| 2009/0056917 | A1 | 3/2009 | Majumdar et al. | |
| 2009/0061149 | A1* | 3/2009 | Shin | B81C 1/00031 428/119 |
| 2009/0308841 | A1* | 12/2009 | Wakamatsu | B82Y 10/00 216/37 |
| 2010/0195916 | A1* | 8/2010 | Blondiaux | G06K 19/086 382/209 |
| 2011/0017431 | A1* | 1/2011 | Yang | F28D 15/046 165/104.26 |
| 2011/0039100 | A1* | 2/2011 | Berenschot | B81C 1/00111 428/364 |
| 2011/0165365 | A1* | 7/2011 | Brault | B81C 1/00269 428/68 |
| 2011/0186543 | A1* | 8/2011 | Hsieh | B05D 3/06 216/37 |
| 2011/0198059 | A1* | 8/2011 | Gavillet | F28D 15/046 165/104.26 |
| 2011/0240595 | A1* | 10/2011 | Dubrow | B05D 1/185 216/37 |
| 2011/0286896 | A1* | 11/2011 | Hess | B01L 3/502707 422/503 |
| 2011/0287227 | A1* | 11/2011 | Moser | B81C 1/00206 428/164 |
| 2012/0051489 | A1* | 3/2012 | Varanasi | F28F 13/182 376/424 |
| 2012/0168131 | A1 | 7/2012 | Gavillet et al. | |
| 2012/0180978 | A1 | 7/2012 | Gavillet et al. | |
| 2013/0312935 | A1 | 11/2013 | Gavillet | |
| 2014/0158334 | A1 | 6/2014 | Dellea et al. | |
| 2014/0238645 | A1* | 8/2014 | Enright | F28D 15/02 165/104.21 |
| 2014/0238646 | A1* | 8/2014 | Enright | F28F 13/187 165/104.21 |

FOREIGN PATENT DOCUMENTS

| | | |
|---|---|---|
| JP | 2004-309002 | 11/2004 |
| JP | 2007-150013 | 6/2007 |
| JP | 2008-39378 | 2/2008 |
| WO | WO 2007/019558 A2 | 2/2007 |

OTHER PUBLICATIONS

French Preliminary Search Report issued Mar. 19, 2009, in French Patent Application No. 0855336 with English translation of category of cited documents.

Sebastine Ujereh, et al., "Effects of Carbon Nanotube Arrays on Nucleate Pool Boiling", International Journal of Heat and Mass Transfer, vol. 50, XP-002520035, Mar. 27, 2007, pp. 4023-4038.

Minglin Ma, et al., "Superhydrophobic Surfaces", Current Opinion in Colloid and Interface Science, vol. 11, No. 4, XP-024966927, Oct. 1, 2006, pp. 193-202.

Tom N. Krupenkin, et al., "From Rolling Ball to Complete Wetting: The Dynamic Tuning of Liquids on Nanostructured Surfaces", Langmuir, vol. 2004, No. 20, XP-002520036, Oct. 2, 2004, pp. 3824-3827.

Lora Kamenova, et al., "Conception and Test of Flat Heat Pipe for 3D Packaging Cooling", Industrial Electronics 2007, XP-002520037, Nov. 5, 2007, pp. 787-792.

Y. Takata, et al., "Effect of surface wettability on boiling and evaporation", Energy, vol. 30, 2005, pp. 209-220.

Seontae Kim, et al, "Experimental Investigation of Critical Heat Flux Enhancement by Micro/Nanoscale Surface Modification in Pool Boiling", Proceedings of the Sixth International ASME Conference on Nanochannels, Microchannels and Minichannels ICNMM2008, Jun. 23-25, 2008, pp. 1-7.

Mohammad Siraj Alam, et al., "Enhanced boiling of saturated water on copper coated heating tubes", Chemical Engineering and Processing, vol. 47, 2008, pp. 159-167.

N. Caney, et al., "Experimental Flow Boiling Study in Mini-Channels", International Heat Transfer Conference, Sydney, Aug. 2006, 12 pages.

A. K. Das, et al., "Nucleate boiling of water from plain and structured surfaces", Experimental Thermal and Fluid Science, vol. 31, 2007, pp. 967-977.

Ryan J. McGlen, et al., "Integrated thermal management techniques for high power electronic devices", Applied Thermal Engineering, vol. 24, 2004, pp. 1143-1156.

Jian Qu, et al., "Effects of Functional surface on performance of a micro heat pipe", International Communications in Heat and Mass Transfer, vol. 35, 2008, pp. 523-528.

L. L. Vasiliev, et al, "Micro and miniature heat pipes—Electronic component coolers", Applied Thermal Engineering, vol. 28, 2008, pp. 266-273.

Yvan Avenas, et al., "Réalisation d'un caloduc plat en silicium", 2003, 5 pages, with English Abstract.

In Cheol Bang, et al., "Boiling heat transfer performance and phenomena of $Al_2O_3$-water nano-fluids from a plain surface in a pool", International Journal of Heat and Mass Transfer, vol. 48, 2005, pp. 2407-2419.

Sarit K. Das, et al, "Pool boiling characteristics of nano-fluids", International Journal of Heat and Mass Transfer, vol. 46, 2003, pp. 851-862.

Charlotte Gillot, et al., "Single- and two-phase heat exchangers for power electronic components", Int. J. Therm. Sci., vol. 39, 2000, pp. 826-832.

(56) References Cited

OTHER PUBLICATIONS

D. Luks, et al. "Thick DLC films deposited by PECVD on the Internal surface of cylindrical substrates", Diamond and Related Materials, 2008, 9 pages.

Ying Ma, et al., "Fabrication of super-hydrophobic film from PMMA with intrinsic water contact angle below 90°", Polymer, vol. 48, 2007, pp. 7455-7460.

David Quèrè, et al., "Non-Sticking drops", Institute of Physics Publishing Rep. Prog. Phys., vol. 68, 2005, pp. 2495-2532.

Dongsheng Wen, et al., "Experimental Investigation into the pool boiling heat transfer of aqueous based γ-alumina nanofluids", Journal of Nanoparticle Research, vol. 7, 2005, pp. 265-274.

S. M. You, et al., "Effect of nanoparticles on critical heat flux of water in pool boiling heat transfer", Applied Physics Letters, vol. 83, No. 16, Oct. 20, 2003, pp. 3374-3376.

U.S. Appl. No. 13/318,649, filed Dec. 8, 2011, Phan, et al.

Notice of Reasons for Rejection issued Mar. 12, 2013 in Japanese Patent Application No. 2011-523379 (English translation only).

\* cited by examiner

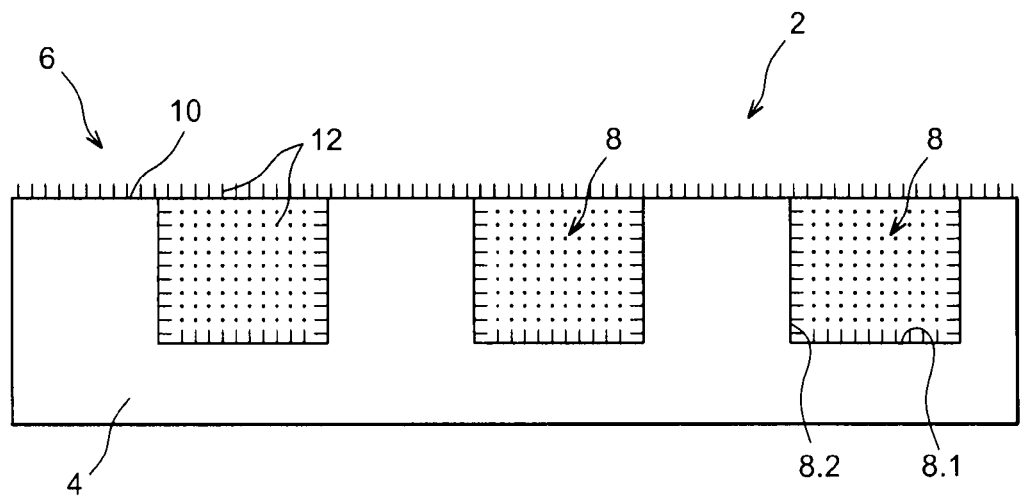
FIG. 1A
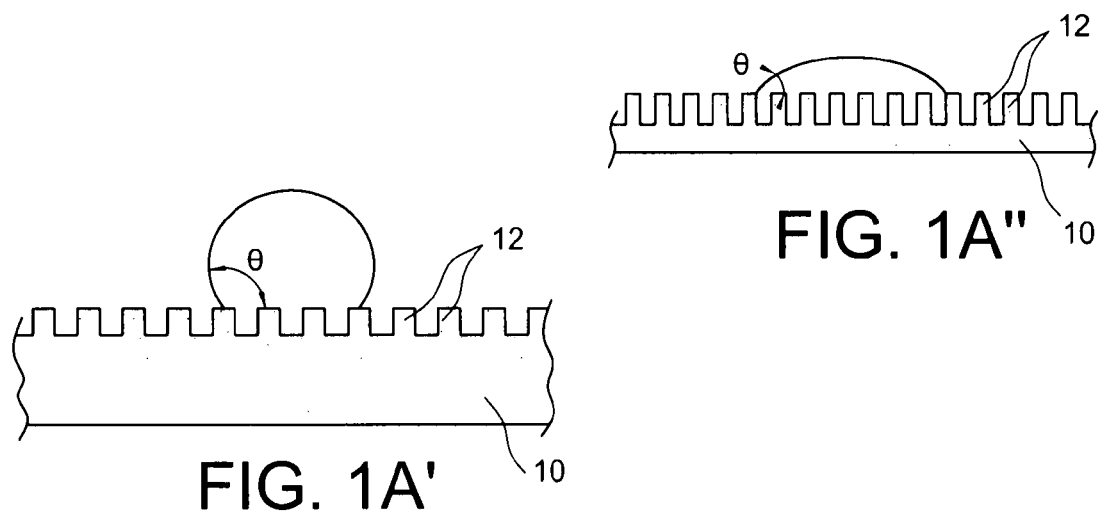
FIG. 1A''
FIG. 1A'
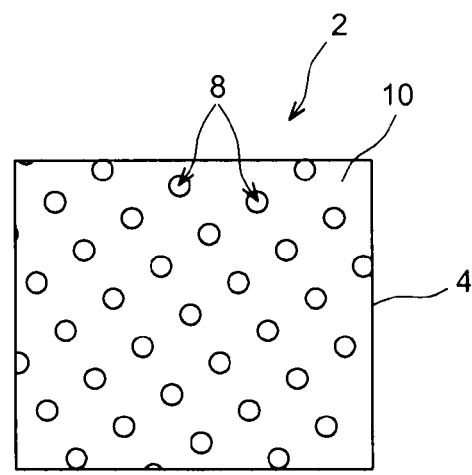
FIG. 1B

HEAT EXCHANGE STRUCTURE AND COOLING DEVICE COMPRISING SUCH A STRUCTURE

CROSS-REFERENCE TO RELATED APPLICATION

This application is a national phase application based on PCT/EP2009/059848, filed on Jul. 30, 2009. This application is also based upon and claims the benefit of priority under 35 U.S.C. §119 from prior French Patent Application No. 08 55336, filed on Aug. 1, 2008. The entire content of each of the above applications is incorporated herein by reference.

TECHNICAL FIELD AND BACKGROUND OF THE INVENTION

The present invention relates to an improved heat exchange structure, and a cooling device comprising such a structure, for example a heat pipe whereof said structure forms the evaporator.

The miniaturization of electronic components, and in particular of power components, poses the problem of integration of the devices for dissipating the heat given off by said components. In the microelectronics and power electronics field, the thermal fluxes to be dissipated are increasingly high and require an ever greater reduction of the thermal resistance. The thermal fluxes to be discharged often have average values around 150-200 W/cm$^2$, but can reach 1000 W/cm$^2$. For these heat flux density levels, the so-called passive cooling methods, such as vaned dissipaters or monophase liquid systems, quickly reach their power limit for power to be extracted.

Other solutions have therefore been imagined such as liquid/vapor diphase heat transfers. The technologies implementing these transfers are the heat pipe, thermosiphon, capillary loops or diphasic pumped loops. The component to be cooled is situated on the cold area of the cooling device, i.e. the evaporator.

One solution for cooling an electronic component is to implement a heat pipe that absorbs the heat at the component and discharges it towards the outside, this solution in particular being described in the document "*Conception and test of flat heat pipe for 3D packaging cooling*" Lora Kamenova, Yvan Avenas, Nathaliya Popova, Christian Schaeffer, Slavka Tzanova, 1-4244-0755-Sep. 7, 2007 IEEE, p. 787-792.

Heat pipes make it possible to increase the thermal conductivity of a heat dissipater. Heat pipes make it possible to transfer thermal power extracted from a given surface towards a secondary surface, often more accessible or offering better heat exchange for dissipation. The heat pipe is a closed system in which a liquid fluid is placed balanced with its vapor. The heat pipe comprises an area forming an evaporator on the side of the electronic component, where the heat to be dissipated is absorbed through vapor formation. The vapor produced to be evaporated migrates through the heart of the heat pipe to a condensation area where the absorbed heat is released by liquefaction of the vapor, the heat is therefore discharged. The condensate returns toward the evaporation areas owing to the capillary forces.

The heat pipe can be attached on the electronic component or integrated on the component, in the case of microelectronic chips, this consists of implanting an array of channels directly on the silicon substrate, thereby reducing the thermal resistance.

Another solution is to make a thermosiphon, the fluid being displaced by gravity, the evaporator being located below the condenser.

Still another solution is the diphasic pumping system using a motor system, a condenser and an evaporator.

All of these solutions therefore use a thermal exchange surface in contact with the component, either attached on the component to be cooled, or formed in the substrate of the component to be cooled, said surface being intended to extract the heat generated in the component. This extraction, as explained above, is done through a phase change by evaporation of a liquid.

The major problem in terms of this exchange surface is the risk of drying of the surface, which leads to a significant decrease of the heat exchange coefficient, and therefore a decrease in the amount of heat evacuated. The temperature of the heat exchange wall then increases, as well as that of the component, this temperature can then become critical for the component.

The drying corresponds to an absence of liquid at the heat exchange surface, which can occur due to excessively high heat fluxes creating a vapor bubble blocked in the channel in the case of a heat pipe, the surface on which the bubble is blocked no longer sees liquid, and the heat extraction cannot take place. This can also occur through rupture of the liquid film intended to be distributed homogeneously over the inner surface of the channel.

Moreover, it has been shown that the wetting surfaces have very good boiling heat transfer performances. For example, in the document Y. Takata, S. Hidaka, J. M. Cao, T. Nakamura, H. Yamamoto, M. Masuda, T. Ito, "*Effect of surface wettability on boiling and evaporation*", *Energy* 30 (2005) 209-220, it is shown that the heat exchange coefficient of a hydrophilic surface obtained by TiO$_2$ deposition is greatly increased, and its heat flow becomes critical relative to an untreated surface.

In the article S. Ujereh, T. Fisher, I. Mudawar, "*Effects of carbon nanotube arrays on nucleate pool boiling*", *Int. J. of Heat and Mass Transfer* 50 (2007) 4023-4038, the heat exchange properties of more or less covered surfaces of carbon nanotubes have been studied, it has been observed that a surface completely covered with nanotubes offers better thermal performance relative to the partially covered surfaces.

Document S. Kim, H. Kim, H. D. Kim, H. S. Ahn, M. H. Kim, J. Kim, G. C. Park, "*Experimental investigation of critical heat flux enhancement by micro/nanoscale surface modification in pool boiling*", *ICNMM*2008, Jun. 23-25, 2008, Darmstadt, Germany shows that a surface combining microstructures and nanostructures makes it possible to reduce the contact angle from 83° to 0° and to increase the critical heat flux by 200%.

Super wetting surfaces therefore appear to be particularly effective to obtain good thermal performance. However, the more the wettability of a surface is increased, the more the energy required to form the first nuclei of vapor is higher. As a result, the vapor bubble formation frequency is reduced in the case of wetting surfaces.

As a result, it is one aim of the present invention to offer a heat exchange device with improved performance, or more generally a heat exchange structure having increased effectiveness.

BRIEF DESCRIPTION OF THE INVENTION

The previously stated aim is achieved by a surface having a micrometric structure and a nanometric structure superimposed on the micrometric surface, the micrometric surface being formed by cavities whereof the inner surface has a low wettability property, and the inter-cavity area has a high wettability property, the proportion of the inner surface of the cavities relative to the total surface being low.

The bottom and the side wall of the cavities are therefore favorable to the generation of vapor nuclei, these cavities being lined with a surface facilitating the release of the bubbles and wetting of the majority of the heat exchange surface.

In other words, a surface is made offering structural heterogeneity with a nanostructure covering a microstructure, and a physicochemical heterogeneity comprising hydrophobic areas facilitating the vapor nuclei creation and hydrophilic areas favoring the release of the bubbles and rewetting.

Advantageously, the bottom and the walls of the cavities have a low wetting hysteresis below 15°, further reducing the activation energy for forming nuclei.

Advantageously, the distribution of the cavities is in the vicinity of 1 to 100 cavities per $mm^2$.

The subject-matter of the present invention then is a heat exchange structure comprising a primary face provided with non-through holes formed in said face, said face provided with holes forming a microstructure, the inner surface of the holes and the surface of said primary face outside the holes being such that they form a nanostructure, the inside of the holes having a non-wettability property relative to a given liquid and the surface of the face between the holes having a wettability property relative to the liquid.

In one preferred example, the holes have a dimension between 1 μm and 10 μm, and are distributed such that there are between 1 hole/$mm^2$ and 100 holes/$mm^2$, and their depth is between 1 μm and 10 μm.

The inner surface of the holes advantageously has a low hysteresis, for example below 15°.

The nanostructure is obtained by depositing nanoparticles whereof the size can be between 1 nm and 100 nm.

The subject-matter of the present invention also is a cooling system comprising an evaporator, a condenser, and a fluid capable of going from a liquid phase to a vapor phase at the evaporator and a vapor phase to a liquid phase at the condenser, said evaporator being a heat exchange structure according to the present invention. It can involve a heat pipe, an array of capillaries bringing the fluid in liquid phase from the condenser to the evaporator.

The subject-matter of the present invention also is an electronic or micro-electronic device comprising a cooling system according to the present invention, the cooling system being attached on a substrate of said device or integrated therein.

The subject-matter of the present invention also is an onboard or portable device comprising a cooling system according to the present invention.

The subject-matter of the present invention also is a method for making a heat exchange structure according to the present invention, comprising the following phases:
  a) making a microstructure comprising non-through holes on or in a substrate,
  b) making a nanostructure on the microstructure,
  c) physicochemical treatment of the surface such that the inner surface of the holes is non-wetting and the surface between the holes is wetting.

In one embodiment, phase a) comprises the following steps:
  depositing a sacrificial layer on a substrate,
  depositing a hard mask on the sacrificial layer, the latter having a high etching selectivity relative to the material of the sacrificial layer,
  depositing a positive resin layer on the hard mask,
  printing and revealing holes,
  opening the hard mask,
  etching the sacrificial layer,
  removing the layer of resin.

For example, the sacrificial layer is a DLC ("Diamond-like-carbon") layer.

The hard mask can be $SiO_2$ or SiC.

The mask can be opened, for example, by a fluorinated plasma and the etching of the sacrificial layer can be done using an oxidizing plasma.

Phase b) can comprise, for example, the deposition of nanoparticles over the entire microstructure formed from the inner surface of the holes and inter-hole areas, the deposition of nanoparticles forming a nano-structured surface.

Phase c) can comprise:
  c1) a step for a hydrophobic treatment of the entire surface of the microstructure covered by the nanostructure,
  c2) a step for a hydrophilic treatment of the inter-hole areas.

Step c1) is, for example, done by depositing a thin film of a hydrophobic material, such as SiOC.

The thickness of the thin film is advantageously smaller than the average roughness of the non-structured surface.

In one embodiment, step c2) can be done by exposing the hydrophobic material to air and scanning the nanostructure surface with a light ray, e.g. a laser ray, with the exception of the inner surface of the holes.

In another embodiment, step c2) is carried out by exposing the hydrophobic material to air and scanning the nanostructure surface with a raking ultraviolet beam, said beam being inclined relative to the surface so as not to scan the inner surface of the holes.

BRIEF DESCRIPTION OF THE DRAWINGS

The present invention will be better understood using the following description and the appended drawings, in which:

FIG. 1A is a cross-sectional view of a heat exchange surface according to the present invention, FIGS. 1A' and 1A" are detail views of FIG. 1A, FIG. 1B is a top view of the surface of FIG. 1A, FIGS. 2A to 2J are diagrammatic illustrations of different steps for making a heat exchange structure according to the present invention shown in cross-section, FIG. 2H' is an enlarged view of a detail of FIG. 2H and FIG. 2I' is a perspective view of FIG. 2I, FIGS. 3A to 3E are diagrammatic illustrations of the different steps for forming a vapor bubble on a surface according to the present invention.

DETAILED DESCRIPTION OF SPECIFIC EMBODIMENTS

Figure 2A:
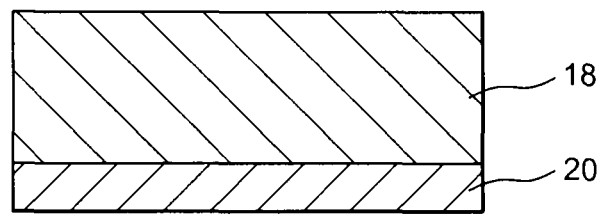

In the following description, the liquid to be evaporated will be an aqueous solution; consequently, we will talk about hydrophilic or hydrophobic surfaces. But it is understood that the present invention is not limited to the use of aqueous solutions; it may for example involve oil, in which case we talk about oleophilic or oleophobic surfaces. More generally, we will talk about wetting or non-wetting surfaces.

FIGS. 1A and 1B show a portion of a heat exchange structure 2 according to the invention comprising a primary face 6 intended to be arranged opposite the component to be cooled, and provided with holes 8, not passing through the other face of the structure.

In the illustrated example, this primary face is carried by a planar plate 4.

The structure can comprise a primary face of any shape, concave, convex, or made up of planar, concave and/or convex surfaces.

The holes 8 comprise a bottom 8.1 and a side wall 8.2.

In the illustrated example, the holes 8 have a circular section, but holes of any other shape, in particular parallelepiped, in particular square, are not outside the scope of the present invention.

The rest 10 of the face 6 not provided with holes and surrounding the holes will hereinafter be designated as "inter-hole area" 10.

Typically, the holes have a diameter between 1 μm and 10 μm, and their distribution is in the vicinity of 1 hole/mm$^2$ and 100 holes/mm$^2$. The depth of the holes is between 1 μm and 10 μm. Under these hole density and size conditions, the proportion of hydrophobic or non-wetting surface is less than about 15%.

The holes 8 thus form a microstructure.

The heat exchange structure also comprises a nanostructure formed by nanoparticles 12 covering the entire face 4, more particularly the bottom 8.1 and the side wall 8.2 of the cavities are covered with nanoparticles, as well as the inter-hole areas 10. The nanoparticles make it possible to increase the specific surface of the structure. These have an average diameter between 1 and 100 nm.

The nanoparticles are for example made from metal, metal alloy, silver, copper, or $Fe_2O_3$, silicon oxide or polymer.

According to the present invention, the holes 8, more particularly the bottom 8.1 and the wall 8.2 of each hole, are non-wetting or have a hydrophobic property relative to a given liquid 16, e.g. water, and the inter-hole areas 10 are wetting relative to the liquid 16.

The bottom 8.1 and the holes 8.2 have greater non-wetting than that of a non-nanostructured surface, while the inter-hole areas offer greater wetting than that of a non-nanostructured surface.

Figure 4:
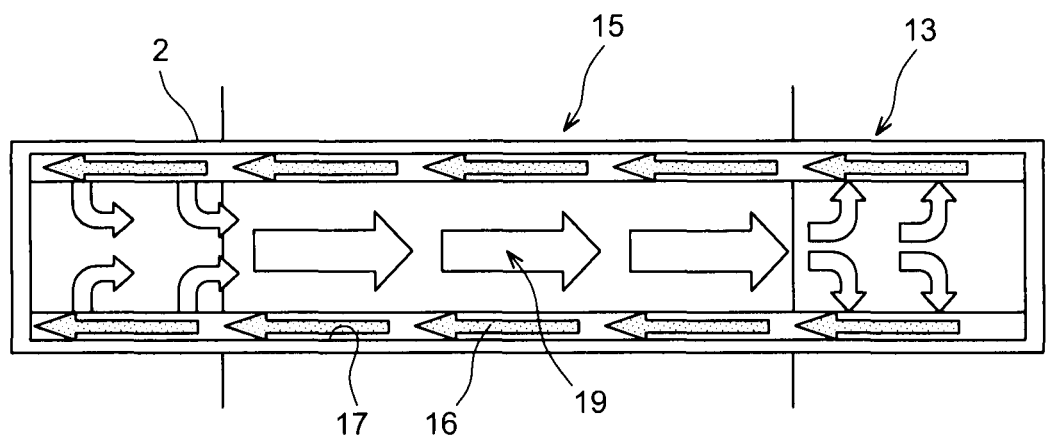
FIG. 4 is a diagrammatic illustration of a heat pipe according to the present invention.

FIG. 4 shows a heat pipe comprising a structure 2 according to the present invention forming the evaporator; it also comprises a condenser 13 and an adiabatic area 15. The adiabatic area 15 is formed by a capillary array 17 that serves as motor for the heat pipe by bringing the condensed liquid fluid 16 towards the evaporator. The arrows 19 symbolize the vapor fluid 19.

In a manner equivalent to the prior art, a heat pipe according to the invention can assume various forms (tubes, coils) relative to the surface of the component to be cooled. In particular, it has a length from several millimeters to several centimeters, while the section of the pipe of the heat pipe, which can have various shapes (square, rectangular, triangular . . . ), is dimensioned at a height of a millimeter or less, more preferably in the vicinity of a tenth of a millimeter.

We will now explain the process for generating vapor nuclei owing to the heat exchange structure 2 according to the invention using FIGS. 3A to 3E.

A hole 8 surrounded by the inter-hole area 10 is visible.

The liquid 16, here water, covers the hole and the inter-hole area.

FIG. 1A' shows an enlarged view of the bottom 8.1 of the cavity, the water covers the top of the nanoparticles trapping air between the nanoparticles 12. This illustration corresponds to a Cassie superhydrophobic state.

FIG. 1A" shows an enlarged view of the hydrophilic inter-hole area 10, the water covers the nanoparticles and fills in the spaces between the nanoparticles. This illustration corresponds to a Cassie superhydrophilic state.

Figure 3A:
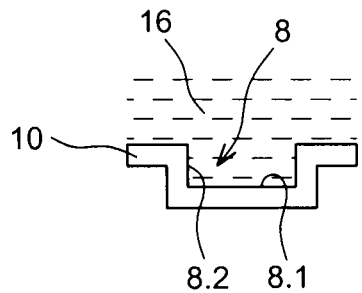
Figure 3B:
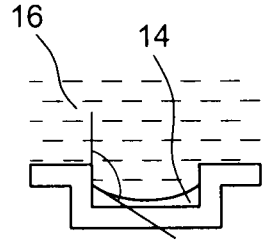

The nanoparticles deposited on the bottom 8.1 and the wall 8.2 of the hole 8 form hydrophobic nucleation sites filled with air in which vapor is balanced with the liquid. The activation energy for forming vapor nuclei is then reduced. As a result, these appear more easily than on a hydrophilic surface. Moreover, due to the very large specific surface, the number of nucleation sites is very high. The creation of a large number of vapor nuclei is therefore facilitated, and they will form, by grouping together, the beginning of a vapor bubble 14 (FIG. 3B).

In fact, the formation of vapor films in the holes is favored. However, these holes represent a relatively small surface relative to the total surface of the structure and therefore relative to the hydrophilic surface, on which wetting is facilitated. The localized drying cannot then cause an increase in the temperature of the component to be cooled.

Figure 3C:
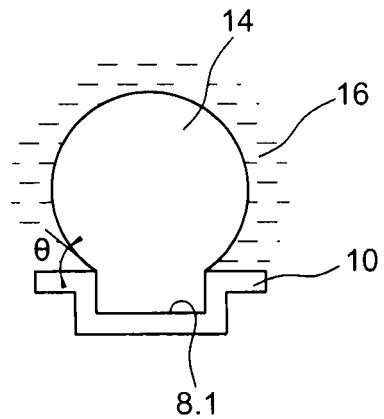
Figure 3D:
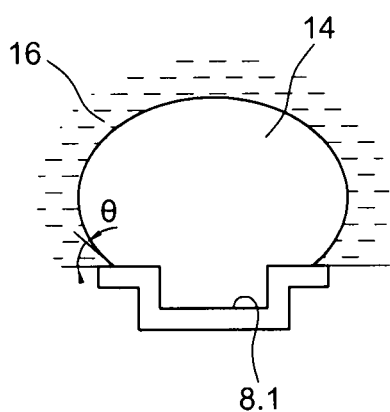
Figure 3E:
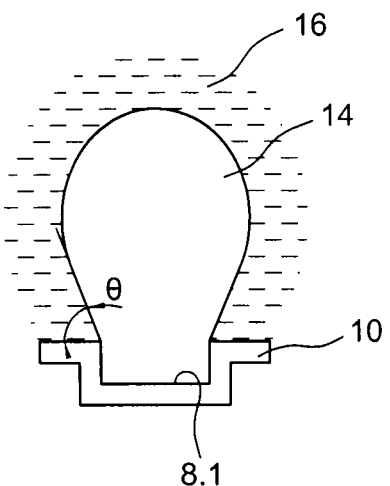

The vapor bubble 14 will then enlarge (FIG. 3C). The inter-hole area being hydrophilic, the contact angle θ at the liquid-vapor interface is smaller than 90°.

The vapor bubble, during its expansion, overhangs the hole and comes into contact with the portion of the inter-hole area surrounding the hole, and there is then a beginning of drying of the inter-hole area.

However, due to the capillarity forces, the triple point is pushed back towards the cavity, ensuring wetting of the inter-hole area.

Lastly, the bubble detaches.

There is then immediate rewetting of the hole 8, which makes it possible to increase the nucleus formation frequency.

The hydrophilic property of the inter-hole space allows a detachment of the vapor bubbles and rewetting of the inter-hole area. The appearance of a vapor film that would prevent heat extraction is thus avoided.

Owing to the invention, it is possible to obtain both easier nucleus creation through the hydrophobic nanostructure, and boiling and rewetting made easier by the hydrophilic microstructure.

We will now describe a method for making such a heat exchange structure.

The structure can either be made directly in the material making up the substrate, e.g. silicon, aluminum, or steel, or in a sacrificial layer deposited beforehand in the small thickness of the substrate.

We will describe this second possibility in detail using a sacrificial layer of the DLC ("Diamond-like-carbon") type. FIGS. 2A to 2I are diagrammatic cross-sectional views of the structure according to the invention at a hole 8 during its different production steps.

Three phases are visible in the production method according to the invention, a microstructuring phase, a nanostructuring phase, and a physicochemical treatment phase.

First, the microstructuring phase occurs.

FIG. 2A shows a first step for depositing a sacrificial layer 18 on the substrate 20, e.g. silicon, steel, or aluminum. The sacrificial layer 18 can be deposited by plasma enhanced chemical vapor deposition (PECVD).

The sacrificial layer 18 is deposited uniformly and evenly on the substrate, over a thickness between 500 nm and 2 μm. This layer is provided so as to be fine and adhesive enough not to alter the heat transfer of the substrate 20.

The sacrificial layer can also be obtained from depositing a thin layer of a material offering a good compromise between its ability to be etched by plasma and its thermal properties. This material can be silicon, silicon oxide, silicon nitride, or silicon carbide, a metal such as aluminum or copper.

Figure 2B:
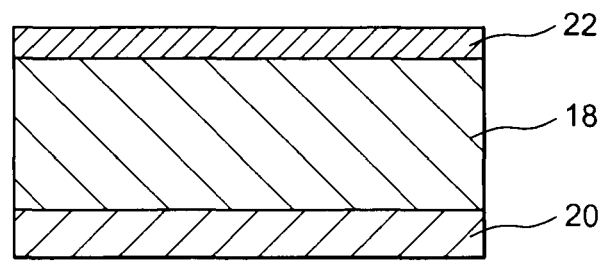

During a following step illustrated in FIG. 2B, a hard mask 22 is deposited on the sacrificial layer 18. The mask 22 for example has a thickness between 50 nm and 200 nm. The material of the mask 22 has a high etching selectivity relative to the sacrificial layer, more particularly relative to the DLC layer under oxidizing plasma conditions. For example, this mask is made from silicon oxide $SiO_2$, silicon carbide, silicon nitride, or metal. The mask 22 can also be deposited by PECVD.

Figure 2C:
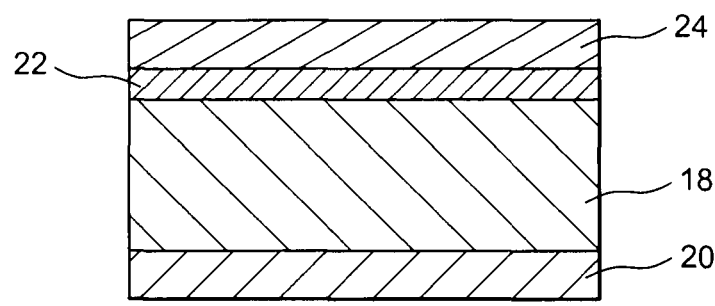

In a subsequent step shown in FIG. 2C, a layer of photo-resin 24 is deposited with a thickness between 0.5 μm and 2 μm.

Figure 2D:
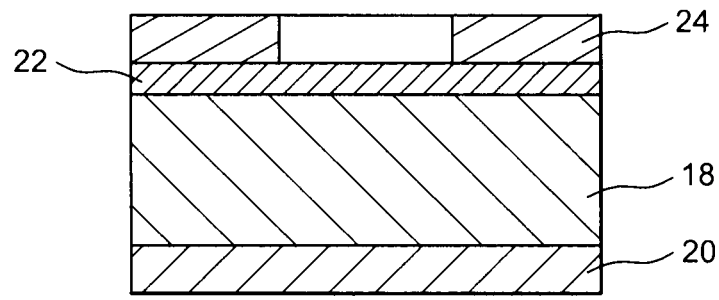

During a subsequent step illustrated in FIG. 2D, holes 8 are printed and revealed by conventional laser or photolithography. The holes thus formed have a diameter between 1 μm and 10 μm. These holes can, as previously explained, have any shape, e.g. square. Their density is between 1 hole/mm² and 100 holes/mm². The dimensions of the holes are chosen based on the critical radius of a nucleation site, which is the minimum stable radius allowing growth of the bubble and the Taylor wavelength for water, the mathematical expressions of which are as follow:

$$-r_c = \frac{2\sigma T_{sat}}{\rho_v h_{lv}(T_p - T_{sat})}, \text{ and}$$

$$-\lambda_T = 2\pi \left[\frac{\sigma}{g(\rho l - \rho_v)}\right]^{1.2}$$

With
$r_c$ the critical radius of a nucleation site,
$\lambda_T$ the Taylor wavelength for water,
σ the superficial voltage of the liquid,
$\rho_1$ and $\rho_v$ the volume masses of the liquid and vapor, respectively,
$h_{1v}$ the latent heat,
$T_p$ and $T_{sat}$ the temperature of the wall and the saturation temperature.

Figure 2E:
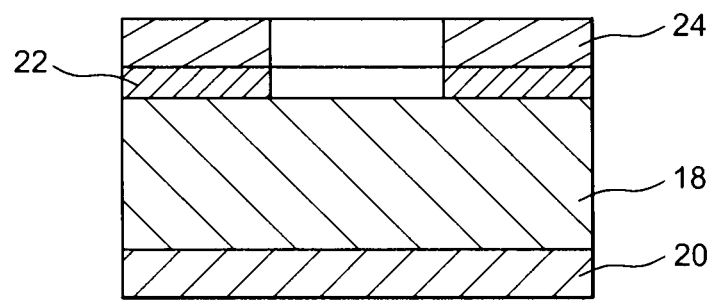

In a subsequent step illustrated in FIG. 2E, the hard mask 22 is opened by a fluorinated plasma to reveal the sacrificial layer 18 made from DLC.

Figure 2F:
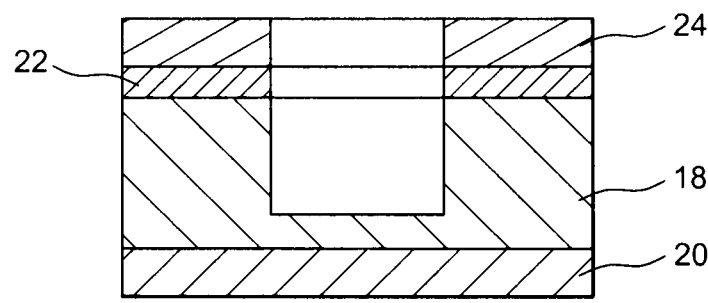

During another step illustrated in FIG. 2F, the sacrificial layer 18 is etched by oxidizing plasma.

Figure 2G:
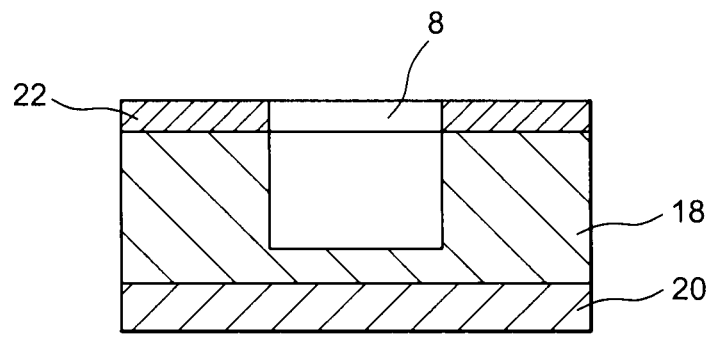

During the step illustrated in FIG. 2G, the photo-resin layer 24 is removed by immersion in a solvent.

Figure 2H:
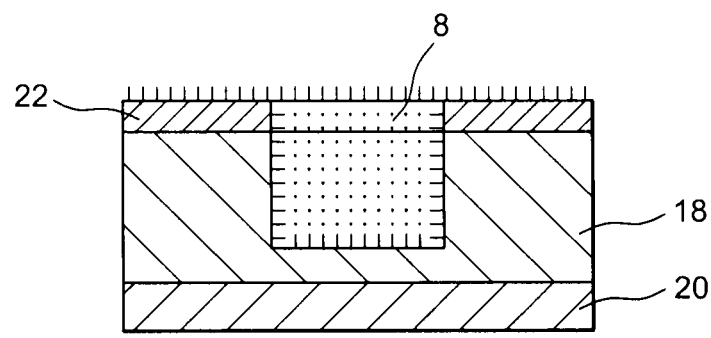

The nanostructuring phase then takes place, during which nanoparticles 12 are deposited uniformly and evenly on the surface obtained during the step illustrated in FIG. 2F. This deposition is shown in FIG. 2H and in FIG. 2H' in perspective view, the deposition of nanoparticles is shown on the bottom 8.1 and the wall 8.2 of the hole 8 and on the inter-hole areas 10.

The nanoparticles 12 have an average diameter between 1 nm and 150 nm. These particles can be formed from various materials deposited using different techniques. As previously indicated, these nanoparticles are intended to increase the specific surface of the structure in order to increase the wetting or non-wetting that will be caused by the subsequent steps.

These particles can be carbon nanotubes obtained using the usual techniques.

These can be metal or metal alloy nanoparticles whereof the size is between 1 nm and 10 nm, deposited using the Mantis procedure. Depositions of silver, platinum, copper, Fe2O3 nanoparticles can be provided using a DLI, MOCBVD or MPA method. It is also possible to consider depositions of silicon oxide or polymers whereof the size is smaller than 100 nm using a nanometric method.

The physicochemical treatment phase then occurs.

Figure 2I:
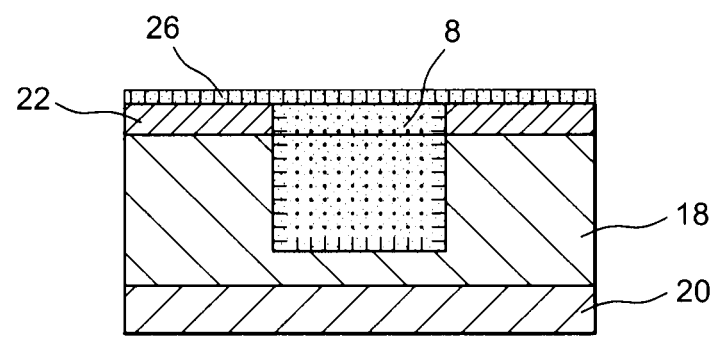
Figure 2H:
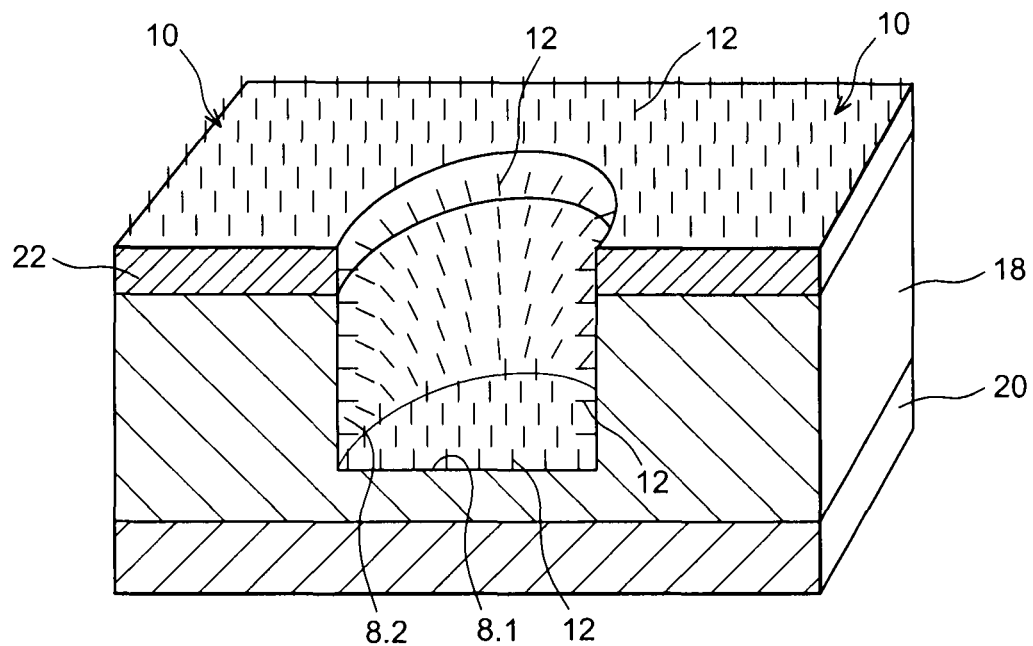

During the step illustrated in FIG. 2I, a film of a hydrophobic material 26 is deposited in a sufficient thickness to uniformly cover the surface, but without erasing the topography created by the nanoparticles (thickness typically less than 10 nm), this material advantageously offers a low wetting hysteresis, preferably less than 15°, over the entire surface of the structure. SiOC offers such a property. The deposition 26 is fine enough for the nanotexturing of the holes 8 to be able to play its role. In FIG. 2I', which is an enlarged view of FIG. 2I, the nanoparticles 12 are visible on an inter-hole area 10 covered with a film 26; it is shown that the film individually covers the nanoparticles 12 without drowning them, the nanostructuring is therefore kept.

Teflon can also be considered, even though it has a wetting hysteresis between 20° and 40°.

The deposition of this hydrophobic layer can be done by PECVD. The thickness of the thin film 26 (shown diagrammatically in gray in FIG. 2I) is less than the average roughness of the surface of the bottom 8.1 and the 8.2 on which the nanoparticles 12 have been deposited, in order to keep a large specific surface. For illustration purposes, the thickness of the film 26 as shown in FIG. 2I is much larger than its actual thickness. The film 26 covers each of the nanoparticles without drowning them, contrary to the illustration, thereby keeping the nanostructuring of the surface.

Figure 2I:
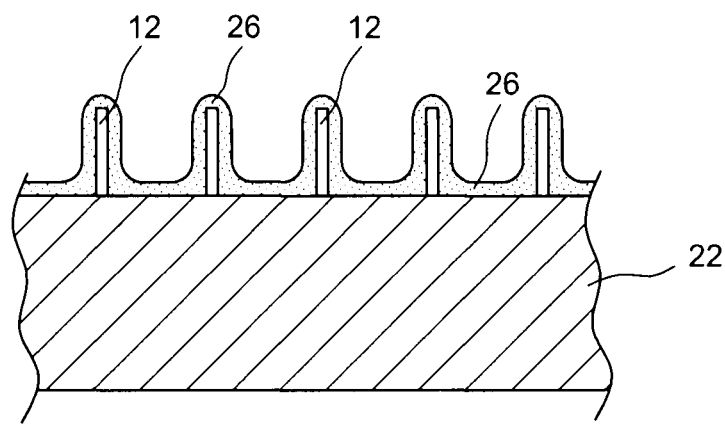
Figure 2J:
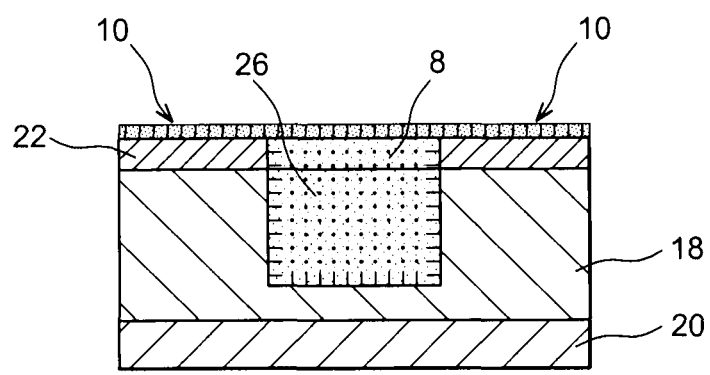

During a later step (FIG. 2J), the inter-hole surfaces 10 are treated so as to make them hydrophilic (shown in squares in FIG. 2J) while keeping the hydrophobic property of the inner surface of the holes (in gray in FIG. 2J).

This hydrophilic treatment can be done by exposing the SiOC film 26 to air and scanning with a light beam leading to its oxidation and the formation of hydrophilic functional groups, e.g. OH or hydroxyls. The scanning does not comprise the holes 8. The light beam can be a laser.

This treatment can also be done by exposing the SiOC to air under a raking ultraviolet beam leading to the formation of hydrophilic groups, as before. The incline of the beam makes it possible to protect the inside of the holes from the oxidation reaction and to keep the hydrophobic power of the holes.

The heat exchange structure according to the present invention is therefore particularly adapted to be used in cooling systems, such as heat pipes, thermosiphons, and diphasic pumping systems, this structure forming the evaporator.

For example in the case of a heat pipe, the structure according to the invention can form a portion of the bottom of the capillaries intended to bring the liquid back from the condenser to the evaporator.

The present invention can be applied to fields having cooling needs with significant fluxes and in which the bulk is prohibitive.

For example, the present invention is particularly adapted to the field of power electronics in which the thermal flux density can reach 1000 W/cm², the microelectronics field, e.g. for cooling microchips, onboard equipment, such as in civil and military aeronautics, and in the spatial industry, and in mobile systems, e.g. for cooling components for mobile telephones, external hard drives . . . .

The invention claimed is:

1. A heat exchange structure, comprising:
a substrate including a plurality of non-through holes disposed therein, the plurality of non-through holes being arranged in a microstructure pattern across a primary face of the substrate, each of the plurality of non-through holes having a continuous sidewall, each continuous sidewall preventing fluid communication with others of the plurality of non-through holes in the microstructure pattern below the primary face of the substrate;

a first nanostructure layer disposed on each bottom of the plurality of non-through holes and on each continuous sidewall of the plurality of non-through holes, the first nanostructure layer having a nanotextured topography of greater surface area than that of said each bottom and said each continuous sidewall disposed thereunder, and the first nanostructure layer including a plurality of vapor nucleation sites collectively disposed between individual nanostructures along the nanotextured topography; and a second nanostructure layer disposed on the primary face of the substrate, wherein the first nanostructure layer disposed on said each bottom and said each sidewall of the plurality of non-through holes is non-wetting relative to a given liquid, and wherein the second nanostructure layer disposed on the primary face of the substrate is wetting relative to the liquid.

2. The heat exchange structure according to claim 1, wherein the holes have a dimension between 1 μm and 10 μm, a depth between 1 μm and 10 μm and are distributed on the primary face such that there is between 1 hole/mm$^2$ and 100 holes/mm$^2$.

3. The heat exchange structure according to claim 1, wherein the ratio between an area of a non-wetting surface of the first nanostructure layer and a total surface area is less than about 15%.

4. The heat exchange structure according to claim 1, wherein an inner surface of the holes has a hysteresis less than 15°.

5. The heat exchange structure according to claim 1, wherein the first nanostructure layer and the second nanostructure layer are obtained by depositing nanoparticles whereof the size is between 1 nm and 100 nm.

6. A cooling system, comprising:
an evaporator;
a condenser; and
a fluid capable of going from a liquid phase to a vapor phase at the evaporator and a vapor phase to a liquid phase at the condenser,
the evaporator being a heat exchange structure comprising a substrate including a plurality of non-through holes disposed therein, the plurality of non-through holes being arranged in a microstructure pattern across a primary face of the substrate, each of the plurality of non-through holes having a continuous sidewall, each continuous sidewall preventing fluid communication with others of the plurality of non-through holes in the microstructure pattern below the primary face of the substrate;
a first nanostructure layer disposed on each bottom of the plurality of non-through holes and on each continuous sidewall of the plurality of non-through holes, the first nanostructure layer having a nanotextured topography of greater surface area than that of said each bottom and said each continuous sidewall disclosed thereunder, and the first nanostructure layer including a plurality of vapor nucleation sites collectively disposed between individual nanostructures along the nanotextured topography; and
a second nanostructure layer disposed on the primary face of the substrate,
wherein the first nanostructure layer disposed on said each bottom and said each sidewall of the plurality of non-through holes is non-wetting relative to a given liquid, and
wherein the second nanostructure layer disposed on the primary face of the substrate is wetting relative to the liquid.

7. The cooling system according to claim 6, forming a heat pipe, an array of capillaries configured to pass the fluid in liquid phase from the condenser to the evaporator.

8. An electronic or microelectronic device, comprising:
a cooling system, comprising:
an evaporator;
a condenser; and
a fluid capable of going from a liquid phase to a vapor phase at the evaporator and a vapor phase to a liquid phase at the condenser,
the evaporator being a heat exchange structure comprising a substrate including a plurality of non-through holes disposed therein, the plurality of non-through holes being arranged in a microstructure pattern across a primary face of the substrate, each of the plurality of non-through holes having a continuous sidewall, each continuous sidewall preventing fluid communication with others of the plurality of non-through holes in the microstructure pattern below the primary face of the substrate;
a first nanostructure layer disposed on each bottom of the plurality of non-through holes and on each continuous sidewall of the plurality of non-through holes, the first nanostructure layer having a nanotextured topography of greater surface area than that of said each bottom and said each continuous sidewall disclosed thereunder, and the first nanostructure layer including a plurality of vapor nucleation sites collectively disposed between individual nanostructures along the nanotextured topography; and
a second nanostructure layer disposed on the primary face of the substrate,
wherein the first nanostructure layer disposed on said each bottom and said each sidewall of the plurality of non-through holes is non-wetting relative to a given liquid, and
wherein the second nanostructure layer disposed on the primary face of the substrate is wetting relative to the liquid,
the cooling system being attached on a substrate of the device or integrated therein.

9. An onboard or portable device, comprising:
a cooling system, comprising:
an evaporator;
a condenser; and
a fluid capable of going from a liquid phase to a vapor phase at the evaporator and a vapor phase to a liquid phase at the condenser,
the evaporator being a heat exchange structure comprising a substrate including a plurality of non-through holes disposed therein, the plurality of non-through holes being arranged in a microstructure pattern across a primary face of the substrate, each of the plurality of non-through holes having a continuous sidewall, each continuous sidewall preventing fluid communication with others of the plurality of non-through holes in the microstructure pattern below the primary face of the substrate;

a first nanostructure layer disposed on each bottom of the plurality of non-through holes and on each continuous sidewall of the plurality of non-through holes, the first nanostructure layer having a nanotextured topography of greater surface are than that of said each bottom and said each continuous sidewall disclosed thereunder, and the first nanostructure layer including a plurality of vapor nucleation sites collectively disposed between individual nanostructures along the nanotextured topography; and a second nanostructure layer disposed on the primary face of the substrate, wherein the first nanostructure layer disposed on said each bottom and said each sidewall of the plurality of non-through holes is non-wetting relative to a given liquid, and wherein the second nanostructure layer disposed on the primary face of the substrate is wetting relative to the liquid.

* * * * *